(12) United States Patent
Kim et al.

(10) Patent No.: US 8,463,833 B2
(45) Date of Patent: Jun. 11, 2013

(54) FILTERING METHOD AND APPARATUS OF LOW COMPLEXITY FIR FILTER, AND RECORDING MEDIUM THEREOF

(75) Inventors: Jewoo Kim, Seongnam-si (KR); Choongsang Cho, Seongnam-si (KR); Byeongho Choi, Yongin-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 821 days.

(21) Appl. No.: 12/616,368

(22) Filed: Nov. 11, 2009

(65) Prior Publication Data

US 2010/0241681 A1   Sep. 23, 2010

(30) Foreign Application Priority Data

Mar. 18, 2009   (KR) ........................ 10-2009-0022913

(51) Int. Cl.
*G06F 17/10*   (2006.01)
(52) U.S. Cl.
USPC ........................................................ 708/319
(58) Field of Classification Search
None
See application file for complete search history.

(56) References Cited

U.S. PATENT DOCUMENTS

| | | | | |
|---|---|---|---|---|
| 4,771,395 A | * | 9/1988 | Watanabe et al. | 708/319 |
| 4,777,612 A | * | 10/1988 | Tomimitsu | 708/316 |
| 7,043,520 B2 | | 5/2006 | Larsson et al. | 708/629 |
| 7,584,236 B1 | | 9/2009 | Lam et al. | 708/319 |

FOREIGN PATENT DOCUMENTS

| | | |
|---|---|---|
| JP | 9-298451 | 11/1997 |
| KR | 2002-0041510 | 6/2002 |
| KR | 1020050106257 A | 11/2005 |

OTHER PUBLICATIONS

Korean Office Action dated Oct. 14, 2010 from corresponding KR Application No. 10-2009-0022913.

* cited by examiner

*Primary Examiner* — David H Malzahn
(74) *Attorney, Agent, or Firm* — Sughrue Mion, PLLC (57) ABSTRACT

A filter method and an apparatus of a low complexity Finite Impulse Response (FIR) filter, and a recording medium thereof are provided. A filtering method of the low complexity FIR filter includes filtering input signals using 2N-ary filters by dividing 2N-ary filter coefficients into even filter coefficients and odd filter coefficients; filtering using a (2N+1)-th filter and the input signals; and adding up a filtering result of the 2N-ary filters and a filtering result of the (2N+1)-th filter. Hence, by reducing the computations of the FIR filter, the FIR filter with the optimal performance can be realized.

24 Claims, 4 Drawing Sheets

FILTERING METHOD AND APPARATUS OF LOW COMPLEXITY FIR FILTER, AND RECORDING MEDIUM THEREOF

PRIORITY

This application claims the benefit under 35 U.S.C. §119 (a) to a Korean patent application filed in the Korean Intellectual Property Office on Mar. 18, 2009 and assigned Serial No. 2009-0022913, the entire disclosure of which is hereby incorporated by reference.

BACKGROUND OF THE INVENTION

1. Field of the Invention

The present invention relates generally to a filtering method and an apparatus of a low complexity Finite Impulse Response (FIR) filter, and a recording medium thereof. More particularly, the present invention relates to a filtering method and an apparatus of a low complexity FIR filter applicable regardless of a filter order by simplifying computations, and a recording medium thereof.

2. Description of the Related Art

Various digital audio, voice, and video electronic devices including mobile communication terminals get rid of noise using a spectrum shaping or a signal scheme. A filter mostly frequently used to remove the noise of the digital electronic device is a Finite Impulse Response (FIR) filter.

The FIR filter has a FIR function h(n), which is expressed as a N-th order polynomial.

Provided that an input signal fed to the N-th order FIR filter is x(n) and its output signal is y(n), the output signal y(n) for the input signal x(n) can be defined by the response function h(n) of the FIR filter as follows:

$$y(n) = \sum_{k=0}^{N-1} h(k)x(n-k) \qquad (1)$$

In Equation (1), h(k) is a filter coefficient, N is a filter order (or tap number) a filter input, and y(n) is a filter output. The operation of the FIR filter based on Equation (1) performs the multiplication for N times by matching the input signals and the filter coefficients one to one and sums up the products. As a result, as the filter coefficients increase, more multipliers and additions are required and the computations also increase.

More specifically, in the signal processing for the audio, the voice, and the video, the computations of the FIR filter take up the audio, voice and video codec computation. Further, in the computation of the audio, voice, and video codec, when the conventional FIR filter as discussed above is used, the filter structure becomes complicated and its computations considerably increase.

SUMMARY OF THE INVENTION

An aspect of the present invention is to address at least the above mentioned problems and/or disadvantages and to provide at least the advantages described below. Accordingly, an aspect of the present invention is to provide a method and an apparatus for simplifying computations by enhancing a Finite Impulse Response (FIR) filtering structure, and a recording medium thereof.

Another aspect of the present invention is to provide a filtering method and an apparatus of a FIR filter applicable regardless of a filter order, and a recording medium thereof.

According to one aspect of the present invention, a filtering method of a low complexity FIR filter includes filtering using 2N-ary filters and input signals, 2N-ary filter coefficients divided into even filter coefficients and odd filter coefficients; filtering using a (2N+1)-th filter and the input signals; and adding up a filtering result of the 2N-ary filters and a filtering result of the (2N+1)-th filter.

The filtering using the 2N-ary filters and the input signals may include calculating a first operation result by operating a pair of consecutive input signals of an input stream and a pair of consecutive filter coefficients comprising the even filter coefficient and the odd filter coefficient divided; calculating a second operation result by operating the divided even filter coefficient and the input signal corresponding to the even filter coefficient; calculating a third operation result by operating the divided odd filter coefficient and the input signal corresponding to the odd filter coefficient; and calculating an n-th output using the acquired first operation result, second operation result, and third operation result.

The filtering method of the low complexity FIR filter further includes calculating an output corresponding to an (n+1)-th input signal of the FIR filter using the calculated n-th output corresponding to the input signal.

According to another aspect of the present invention, a filtering method of a low complexity FIR filter includes determining whether a filter order is an integral multiple of 2; a first filtering operation for filtering using 2N-ary filter coefficients and input signals when the filter order is the integral multiple of 2, the 2N-ary filter coefficients divided into even filter coefficients and odd filter coefficients; and a second filtering operation for filtering by dividing into 2N-ary filter coefficients and the other filter coefficient when the filter order is not the integral multiple of 2, operating the 2N-ary filter coefficients using the first filtering operation, and adding the operation result and an operation result of the other filter coefficient.

According to yet another aspect of the present invention, a low complexity FIR filter includes a 2N filter order processor for filtering using 2N-ary filters and input signals, 2N-ary filter coefficients divided into even filter coefficients and odd filter coefficients; a (2N+1)-th filter order processor for filtering using a (2N+1)-th filter coefficient and the input signals; and an addition part for adding up a result of the 2N filter order processor and a result of the (2N+1)-th filter order processor.

According to still another aspect of the present invention, a low complexity FIR filter includes a filter order determiner for determining whether a filter order is an integral multiple of 2; a first filter for filtering using 2N-ary filter coefficients and input signals when the filter order is the integral multiple of 2, the 2N-ary filter coefficients divided into even filter coefficients and odd filter coefficients; and a second filter for filtering by dividing into 2N-ary filter coefficients and the other filter coefficient when the filter order is not the integral multiple of 2, operating the 2N-ary filter coefficients using the first filtering operation, and adding the operation result and an operation result of the other filter coefficient.

According to a further aspect of the present invention, a storage medium readable by a computer storing a program to execute the filtering method of the low complexity FIR filter is provided.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will become more apparent from the following detailed description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Exemplary embodiments of the present invention provide filtering method and apparatus of a low complexity Finite Impulse Response (FIR) filter, and a recording medium thereof.

Figure 1:
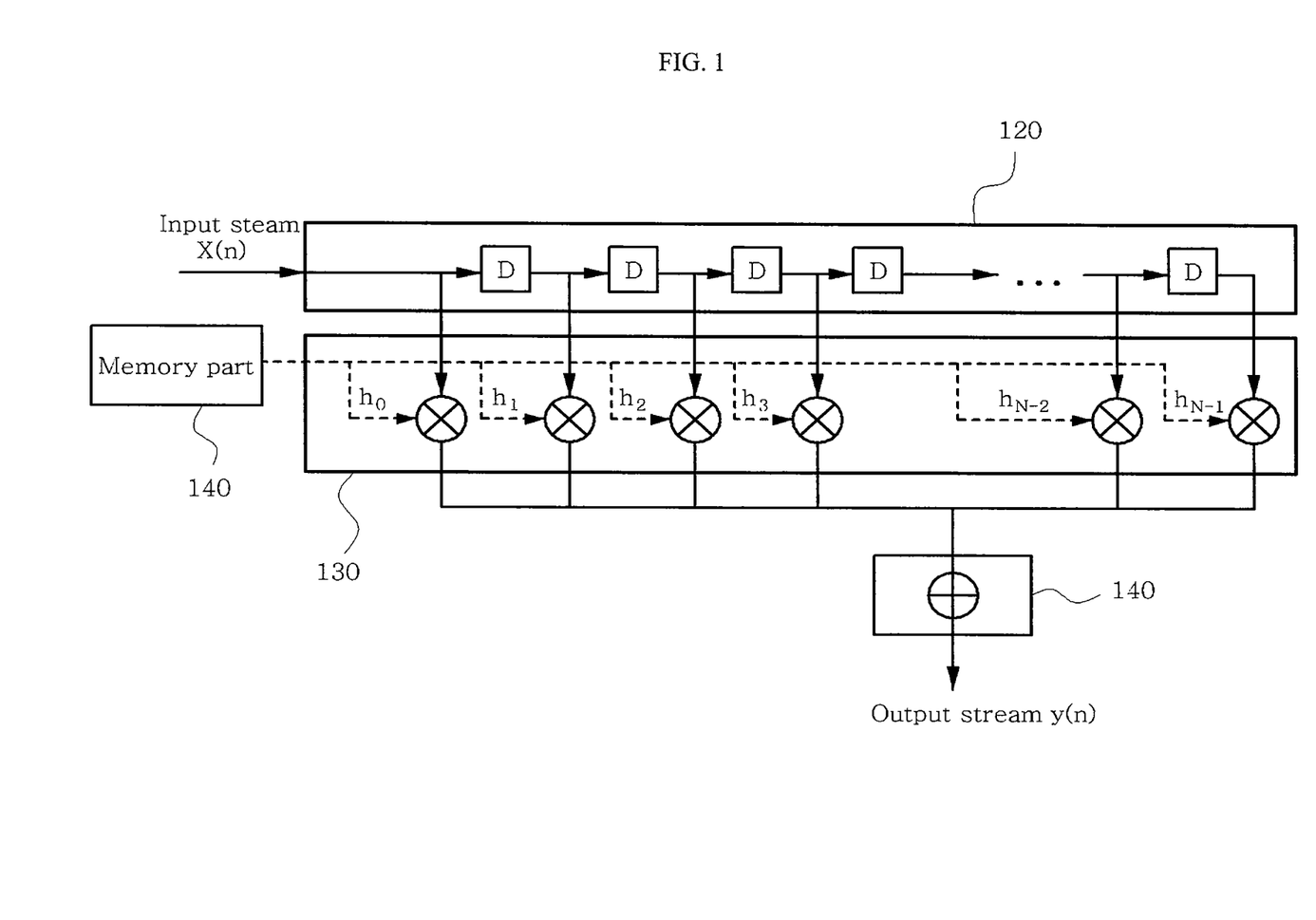
FIG. 1 is a block diagram of a Finite Impulse Response (FIR) filter.
Figure 2:
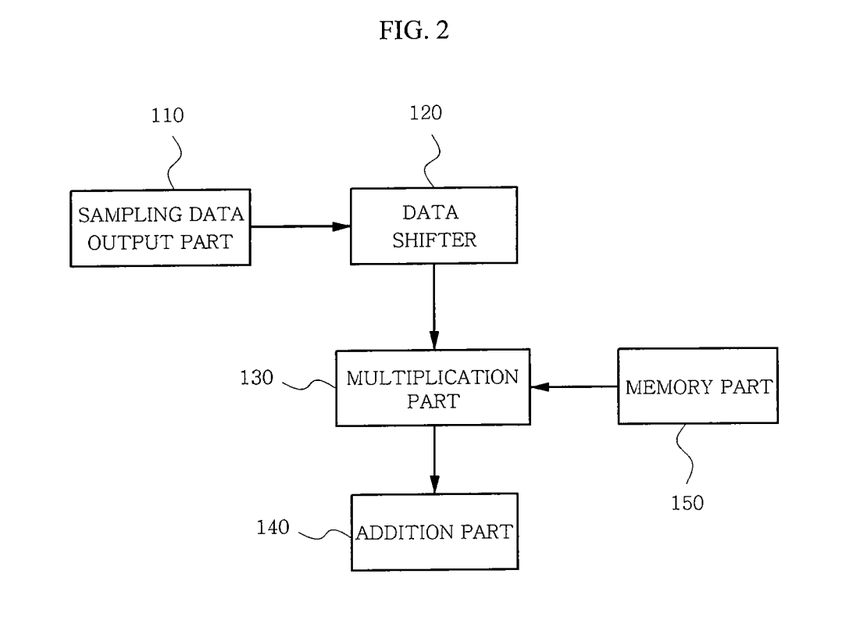
FIG. 2 is a diagram of a general structure of the FIR filter.

FIG. 1 is a block diagram of a general FIR filter, and FIG. 2 is a structure diagram of the FIR filter of FIG. 1.

Referring to FIGS. 1 and 2, the FIR filter 100 includes a sampling data output part 110, a data shifter 120, a multiplication part 130, an addition part 140, and a memory part 150

The sampling data output part 110 includes a certain number of flip-flops (not shown) for synchronizing with a clock signal and shifting an input stream.

The data shifter 120 shifts the input stream in order to perform a next operation when one-cycle operation ends with respect to the input stream output from the sampling data output part 110.

Accordingly, the current input signals fed through the shifting process are calculated together with past input signals being shifted.

The multiplication part 130 includes a plurality of multipliers and multiplies filter coefficients output from the memory part 150 storing the filter coefficients of the FIR filter by the signals output from the flip-flops of the sampling data output part 110.

The addition part 140 includes a plurality of adders and sums up the products output from the multipliers of the multiplication part 130

Figure 3:
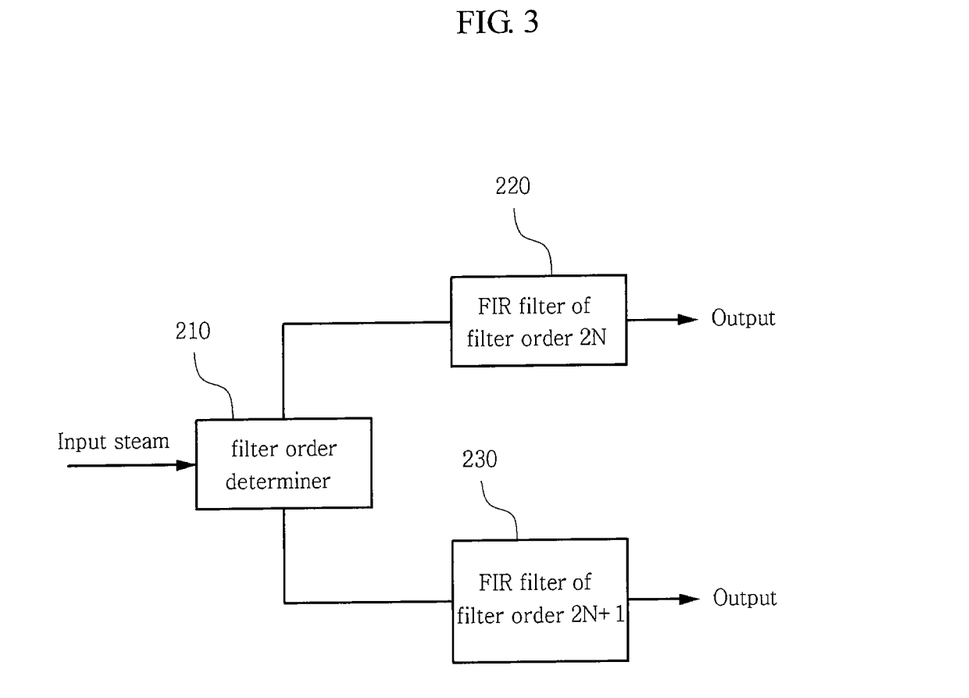
FIG. 3 is a block diagram of a low complexity FIR filter according to an exemplary embodiment of the present invention.
Figure 4:
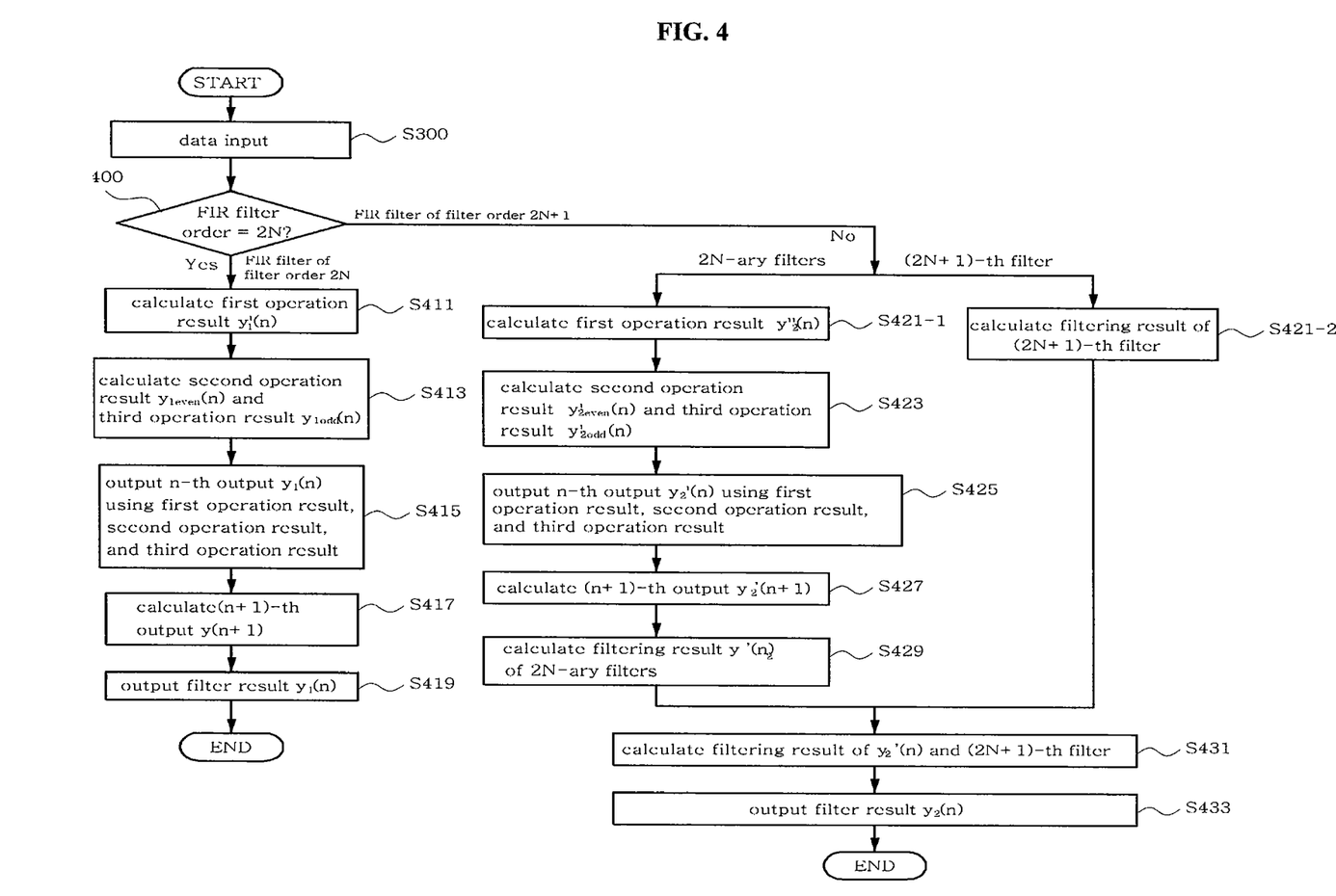
FIG. 4 is a flowchart of a filtering method of the low complexity FIR filter according to a filter order.

FIG. 3 is a block diagram of a low complexity FIR filter according to an exemplary embodiment of the present invention, and FIG. 4 is a flowchart of a filtering method of the low complexity FIR filter according to a filter order.

Referring now to FIGS. 3 and 4, the FIR filter of the present invention include a filter order determiner 210, a FIR filter 220 of the even filter order (hereafter, referred to as a first filter), and a FIR filter 230 of the odd filter order (hereafter, referred to as a second filter).

The first filter 220 carries out the operation by dividing the filter coefficient to the even part and the odd part to simplify the calculation. More specifically, as filtering using 2N-ary filters and the input signals, the first filter 220 divides the 2N-ary filter coefficients to the even filter coefficients and the odd filter coefficients succeeding the even filter coefficients, and multiplies the pair of the consecutive filter coefficients by the pair of the consecutive input signals of the input stream. The multiplication is applied to every consecutive filter coefficient and the output of the 2N-ary filters is produced by finally summing up the results of the multiplications of the filter coefficients.

When data is input (S300), the filter coefficient determiner 210 determines whether the filter order is even or odd (S400). When the filter order is even according to the determination, the first filter 220 filters the input signals. Now, the operations of the first filter are elucidated based on equations.

The general FIR filter of FIG. 1 multiplies the filter coefficients $h(k)(k=0,1,\ldots,(N-1)$ by the input signals $x(n)$ one to one, whereas the first filter 220 carries out the operation by dividing the filter coefficients $h(k)(k=0,1,\ldots,(N-1)$ to $h(2k)$, $h(2k+1)(k=0,1,\ldots,(N/2-1)$.

The operation of the first filter 220 can be given by Equation (2) as follows:

$$y'_1(n) = \sum_{k=0}^{N/2-1} (h(2k) + h(2k+1))[x(n-2k) + x(n-2k-1)] \quad (2)$$

$y_1'(n)$ is newly defined to simplify the calculations at the first filter 220 (hereafter, referred to as a first operation result), and N is the filter order.

The first filter 220 multiplies the pair of the consecutive input signals of the input stream by the pair of the consecutive filter coefficients divided into the even filter coefficient and the even filter coefficient, sums up the multiplication results, and thus outputs the first operation result.

In further detail, the first filter 220 divides the filter coefficients $h(2k)(k=0,1,\ldots,(N-1)$ to the even filter coefficient $h_{2k}$ and the odd filter coefficient $h(2k+1)(k=0,1,\ldots,(N/2-1)$, multiplies the pair of the filter coefficients $h(2k)$ and $h(2k+1)$ by the corresponding pair of the input signals $x(n-2k)$ and $x(n-2k-1)$, sums up the multiplication results, and thus yields the first operation result $y_1'(n)$.

Also, the first filter 220 multiplies the even filter coefficient $h(2k)(k=0,1,\ldots,(N/2-1)$ of the divided filter coefficients by the input signal corresponding to the even filter coefficients and yields a second operation result $y_{1even}$ by summing up the products. The second operation result is given by Equation (3) as follows:

$$y_{1even}(n-1) = \sum_{k=0}^{N/2-1} h(2k)x(n-2k-1) \quad (3)$$

N is the filter order, $y_{1even}(n-1)$ is the even coefficient part of $y(n-1)$, and $h(2k)$ is the even filter coefficient.

The first filter 220 multiplies the odd filter coefficients h(2k+1)(k=0,1, . . . , (N/2−1) of the divided filter coefficients by the input signals corresponding to the odd filter coefficients and yields a third operation result $y_{1odd}$ by summing up the products. The third operation result is given by Equation (4) as follows:

$$y_{1told}(n+1) = \sum_{k=0}^{N/2-1} h(2k+1)x(n-2k) \quad (4)$$

N is the filter order and $y_{1odd}(n+1)$ is the odd coefficient part of y(n+1).

Meantime, the derivation of $y_{1even}(n-1)$ and $y_{1odd}(n+1)$ through the operations of $y_{even}(n-1)$ and $y_{odd}(n+1)$ is explained based on Table 1.

TABLE 1

| Filter coefficient Input stream | h0 | h1 | h2 | h3 | h4 | h5 | ... | h(N − 2) | h(N − 1) | Operation result |
|---|---|---|---|---|---|---|---|---|---|---|
| First input stream | x(n − 1) | x(n − 2) | x(n − 3) | x(n − 4) | x(n − 5) | x(n − 6) | ... | x(1) | x(0) | $y_{even}(n-1) = \sum_{k=0}^{N/2-1} h(2k) \times (n-2k-1)$ |
| Second input stream | x(n) | x(n − 1) | x(n − 2) | x(n − 3) | x(n − 4) | x(n − 5) | ... | x(2) | x(1) | $y(n) = \sum_{k=0}^{N-1} h(k) \times (n-k)$ |
| Third input stream | x(n + 1) | x(n) | x(n − 1) | x(n − 2) | x(n − 3) | x(n − 4) | ... | x(3) | x(2) | $y_{odd}(n+1) = \sum_{k=0}^{N/2-1} h(2k+1) \times (n-2k)$ |

In Table 1, to derive $y_{even}(n-1)$ and $y_{odd}(n+1)$, $y_{even}(n-1)$ is acquired by multiplying h(2k)(k=0,1, . . . , (N/2−1) by the input signals of the input stream corresponding to h(2k) and summing up the products.

For example, $y_{even}(n-1)=h(0)\times x(n-1)+h(2)\times x(n-3)+h(4)\times x(n-5)+ \ldots +h(N-2)\times x(1)$, and N/2-time multiplications and N/2−1 times additions are carried out because only the even filter coefficients h(0), h(2), h(4), . . . of the filter coefficients h(k) are used for the filtering operation. In so doing, the value k starts from 0, not from 1. To ease the understanding, h(0) is defined as the first filter coefficient.

$y_{odd}(n+1)$ is acquired by multiplying h(2k+1)(k=0,1, . . . , (N/2−1) by the input signals of the third input stream corresponding to h(2k+1) and summing up the products. The input signals corresponding to h(2k+1) are shifted from the input signals used to derive y(n).

For example, $y_{odd}(n-1)=h(1)\times x(n-1)+h(3)\times x(n-3)+h(5)\times x(n-5)+ \ldots +h(N-1)\times x(0)$, and N/2-time multiplications are carried out because only the odd filter coefficients h(1), h(3), h(5), . . . of the filter coefficients h(k) are used for the filtering operation.

Notably, the filtering method of the present invention extracts y(n) using $y_{even}(n-1)$, $y_{odd}(n+1)$ and $y_1'(n)$, rather than directly calculating y(n) as shown in Table 1. In Table 1, y(n) indicates the result after shifting the input stream so as to facilitate the understanding of the calculations of $y_{even}(n-1)$ and $y_{odd}(n+1)$.

Equation (2) can be re-expressed as Equation (5).

$$y_1'(n)=y(n)+y_{even}(n-1)+y_{odd}(n+1) \quad (5)$$

That is, the first operation result is expressed using the second operation result and the third operation result.

Using the first operation result, the second operation result, and the third operation result acquired, the output $y_1(n)$ of the first filter 220 is calculated.

The conventional FIR filter directly calculates the output y(n) through the N-time multiplications and N−1 time additions, whereas the first filter 220 of the present invention calculates $y_1(n)$ using the first operation result $y_1'(n)$, the second operation result $y_{1even}(n-1)$, and the third operation result $y_{1odd}(n+1)$ which each perform the N/2-time multiplications and N/2−1 time additions, rather than directly calculating the output $y_1(n)$. Namely, 3N/2-time multiplications and (3N/2−1)-time additions can yield $y_1(n)$.

Using the first operation result, the second operation result, and the third operation result, $y_1(n)$ can be calculated based on Equation (6).

$$y_1(n)=y_1'(n)-y_{1even}(n-1)-y_{1odd}(n+1) \quad (6)$$

Similarly, $y_1(n+1)$ can be divided to $y_{1even}(n+1)$ and $y_{1odd}(n+1)$ and expressed as Equation (7).

$$y_1(n+1)=y_{1even}(n+1)+y_{1odd}(n+1) \quad (7)$$

$y_1(n+1)$ can be acquired from only one addition using the pre-calculated $y_{1even}(n+1)$ and $y_{1odd}(n+1)$, rather than from new multiplications.

Herein, $y_{1odd}(n+1)$ can be acquired from Equation (4), and $y_{1even}(n+1)$ can use the result of Equation (8) based on Equation (6).

$$y_1(n+2)=y_1'(n+2)-y_{1even}(n+1)-y_{1odd}(n+3) \quad (8)$$

Thus, the calculations of y(n) and y(n+1) conduct 3N/4-time multiplications and 3N/4+1/2-time additions per output on average.

This reduces the computations by 25% or so, compared with the N-time multiplications and the (N−1)-time additions of the conventional FIR filter.

When the filter order determiner 210 determines the odd filter order, the second filter 230 performs the filtering. Now, the operations of the second filter 230 are explained based on equations.

When the filter order is 2N+1 (N is an integer over 0), the second filter 230 filters using the 2N-ary filters and (2N+1)-th filter. The filtering using the 2N-ary filters are the same as in the filtering by the first filter, which filters input signals using 2N-ary filters by dividing 2N-ary filter coefficients into even filter coefficients and odd filter coefficients. The last (2N+1)-th filter filters by multiplying the (2N+1)-th filter coefficient by the input signal.

Next, the output of the filter of the filter order 2N+1 is obtained by adding the filtering result of the 2N-ary filters and the filtering result of the last (2N+1)-th filter. The filter output $y_2(n)$ when the filter order is 2N+1 is calculated based on Equation (9).

$$y_2(n) = \sum_{k=0}^{N-2} h(k)x(n-k) + h(N-1)x(n-(N-1)) \quad (9)$$

$y_2(n)$ denotes the operation result of the second filter 230, and $h(N-1)x(n-(N-1))$ denotes the operation result of the (2N+1)-th filter.

Herein, $y_2(n)$ can be expressed as Equation (10).

$$y_2(n) = y_2'(n) + h(N-1)x(n-(N-1)) \quad (10)$$

$$y_2'(n) \cong \sum_{k=0}^{N-2} h(k)x(n-k),$$

$y_2(n)$ denotes the output of the second filter 230, and $y_2'(n)$ denotes the operation result of the 2N-ary filters when the filter order is 2N+1.

Herein, $y_2'(n)$ requires (N−1)+1=N-time multiplications and N−1 time additions. To reduce the computations, $y_2''(n)$ is defined for the calculation in the same manner as $y_1(n)$. That is, $y_2'(n)$ is calculated using $y_2''(n)$, $y'_{2even}(n-1)$, and $y'_{2odd}(n+1)$ based on Equation (11).

$$y_2'(n) = y_2''(n) - y'_{2even}(n-1) - y'_{2odd}(n+1) \quad (11)$$

$y_2''(n)$ is newly defined to simplify the calculation, $y'_{2even}(n-1)$ is the even coefficient part of $y_2'(n-1)$, and $y'_{2odd}(n+1)$ is the odd coefficient part of $y_2'(n+1)$. $y_2''(n)$, $y'_{2even}(n-1)$, and $y'_{2odd}(n+1)$ are the same as in the case where the filter order is 2N.

$y_2'(n+1)$ is calculated using $y'_{2even}(n-1)$ and $y'_{2odd}(n+1)$ based on Equation (7), and another output $y_2(n+1)$ of the second filter 230 can be produced by combining $y_2'(n+1)$ and the (2N+1)-th filter.

Hence, the calculations of $y_2(n)$ and $y_2(n+1)$ require 3(N−1)/4+1 multiplications and 3N/4+3/2 additions per output on average, which reduces the computations by 25% or so, compared to the conventional FIR filter taking N multiplications and N−1 additions.

Thus, when the filter order is 2N+1 (N is an integer over 0), the 2N-ary filter coefficients and the one filter coefficient are separately processed and their processing results are combined at the final stage.

A method for applying the low complexity FIR filter regardless of the filter order according to an exemplary embodiment of the present invention is now illustrated by referring to FIG. 4.

When the data is input to the filter through the sampling data output part 111 (S300), the filter order determiner 210 determines whether the filter order is 2N or 2N+1 (S400). When the filter order is 2N according to the determination, 2N-ary filters carry out the filtering.

When the filter order is 2N (N is the integer over 0), the first operation result is acquired by defining $y_1'(n)$ which divides the filter coefficients to the even filter coefficients and the odd filter coefficients and performs the multiplications and the additions (S411).

The first operation result $y_1'(n)$ is expressed with $y_1(n)$, $y_{1even}(n)$ and $y_{1odd}(n)$, $y_1(n)$ requires N time multiplications and N−1 time additions, and $y_{1even}(n)$ and $y_{1odd}(n)$ each require N/2 time multiplications and (N/2-1) time additions.

Referring back to Equation (2), the first operation result $y_1'(n)$ also requires N/2 multiplications and (N/2-1) time additions. Thus, without directly computing $y_1(n)$, $y_1(n)$ is calculated using $y_1'(n)$, $y_{1even}(n)$ and $y_{1odd}(n)$ (S415). For doing so, the second operation result $y_{1even}(n)$ and the third operation result $y_{1odd}(n)$ are calculated based on Equation (3) and Equation (4) (S413).

Since the filter coefficients are divided into the even parts and the odd parts, not only $y_1(n)$ but also the (n+1)-th output $y_1(n+1)$ are calculated together (S417). The (n+1)-th output is expressed by dividing into the even coefficient part $y_{1even}(n+1)$ and the odd coefficient part $y_{1odd}(n+1)$ as expressed in Equation (7). Since $y_{1even}(n+1)$ and $y_{1odd}(n+1)$ make use of the pre-calculated values, the computations in the $y_1(n+1)$ calculation can be considerably reduced.

The filter result $y_1(n)$ of the 2N-ary filters is output (S419).

When the filter order is 2N+1 (N is the integer over 0), the filter coefficients are divided to the filtering of the 2N-ary filters and the filtering of the (2N+1)-th filter. That is, the 2N-ary filters yield the output value in the same manner as mentioned above and adds up the result and the output value of the other filter.

By applying the same calculation of the 2N filter, the first operation result is computed by defining $y_2''(n)$ which divides the filter coefficients to the even filter coefficients and the odd filter coefficients and performs the multiplications and the additions (S421_1).

The second operation result $y'_{2even}(n-1)$ and the third operation result $y'_{2odd}(n+1)$ are calculated (S423), and the n-th output $y_2'(n)$ of the 2N-ary filters is calculated using the first operation result, the second operation result, and the third operation result (S425). As in the 2N-ary filters stated earlier, the (n+1)-th output $y_2'(n+1)$ is calculated using the even coefficient part and the odd coefficient part of $y_2'(n)$ (S427). Next, the filter result $y_2'(n)$ of the 2N-ary filters is yielded (S429).

Herein, the filtering result of the (2N+1)-th filter is independently calculated (S421_2). The filtering result of the FIR filter of the filter order 2N+1 is output by adding the independently acquired result and the output $y_2'(n)$ of the 2N-ary filters (S431).

Table 2 shows experiment results which measure the rate of the computation reduction according to an exemplary embodiment of the present invention. When the filtering method of the present invention is applied, the computation reduction rate is measured in terms of MIPS, WMOPS, and MCPS.

TABLE 2

| | Order | | | | | |
|---|---|---|---|---|---|---|
| | Even LPC order | | | Odd LPC order | | |
| Method | MIPS | WMOPS | MCPS | MIPS | WMOPS | MCPS |
| Before | 4.23 | 9.60 | 15.31 | 4.61 | 10.47 | 16.60 |
| After | 3.51 | 7.44 | 11.33 | 3.89 | 8.31 | 12.66 |
| Performance rate | 0.83 | 0.81 | 0.74 | 0.84 | 0.83 | 0.76 |

MOPS and WMOPS are the complexity measured at PC, and MCPS is the complexity measured at a Digital Signal Processor (DSP). When the filtering method of the present invention is adopted, the computation reduction of MIPS about 16%, WMOPS 18%, and MCPS about 25% are produced as shown in Table 2.

In the meantime, the exemplary embodiments of the present invention can be written with a program executable at a computer, and implemented at a general digital computer which executes the program using a storage medium readable by the computer. The storage media readable by the computer include magnetic storage media (e.g., ROM, floppy disc, hard disc, etc.), optical readable media (e.g., CD ROM, DVD, etc.), and carrier waves (e.g., transmission over the Internet).

In the light of the foregoing as set forth above, by reducing the computations of the FIR filter, the FIR filter with the optimal performance can be realized.

In addition, the FIR filter applicable regardless of the filter order can be accomplished.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A filtering method of a Finite Impulse Response (FIR) filter of a filter order 2N+1, where N is an integer greater than 0, the method comprising:
    filtering an input stream using 2N-ary filters by dividing 2N filter coefficients into even filter coefficients and odd filter coefficients;
    filtering the input stream using a (2N+1)-th filter and a (2N+1)-th coefficient; and
    adding up a filtering result of the 2N-ary filters and a filtering result of the (2N+1)-th filter,
    wherein the 2N-ary filters comprise 2N multipliers multiplying the input stream by the 2N filter coefficients, respectively.

2. The filtering method of claim 1, wherein the filtering the input stream using the 2N-ary filters comprises:
    calculating a first operation result by multiplying a pair of consecutive input signals of the input stream and a pair of consecutive filter coefficients comprising an even filter coefficient among the even filter coefficients and an odd filter coefficient among the odd filter coefficients, respectively;
    calculating a second operation result by multiplying the even filter coefficient and an input signal corresponding to the even filter coefficient;
    calculating a third operation result by multiplying the odd filter coefficient and an input signal corresponding to the odd filter coefficient; and
    calculating an n-th output of the input stream using the first operation result, the second operation result, and the third operation result.

3. The filtering method of claim 2, wherein the first operation result is calculated based on the following equation:

$$y''_2(n) = \sum_{k=0}^{N/2-1} (h(2k) + h(2k+1))[x(n-2k) + x(n-2k-1)]$$

where N is a filter order, $y2''(n)$ is the first operation result, $x(n-2k)$ and $x(n-2k-1)$ are the pair of the consecutive input signals, and $h(2k)$ and $h(2k+1)$ are the even filter coefficient and the odd filter coefficient respectively, which are the pair of the consecutive filter coefficients.

4. The filtering method of claim 2, wherein the second operation result is calculated based on the following equation:

$$y'_{2even}(n-1) = \sum_{k=0}^{N/2-1} h(2k)x(n-2k-1)$$

where N is a filter order, $y'_{2even}(n-1)$ is the second operation result, $h(2k)$ is the even filter coefficient, and $x(n-2k-1)$ is an input signal corresponding to the filter coefficient $h(2k)$.

5. The filtering method of claim 2, wherein the third operation result is calculated based on the following equation:

$$y'_{2odd}(n+1) = \sum_{k=0}^{N/2-1} h(2k+1)x(n-2k)$$

where N is a filter order, $y'_{2odd}(n+1)$ is the third operation result, $h(2k+1)$ is the odd filter coefficient, and $x(n-2k)$ is an input signal corresponding to $h(2k+1)$.

6. The filtering method of claim 2, wherein the n-th output is calculated based on the following equation:

$$y'_2(n) = y''_2(n) - y'_{2even}(n-1) - y'_{2odd}(n+1)$$

where $y'_2(n)$ is the n-th output, $y''_2(n)$ is the first operation result, $y'_{2even}(n-1)$ is the second operation result, and $y''_{2odd}(n+1)$ is the third operation result.

7. The filtering method of claim 2, further comprising:
    calculating an (n+1)-th output using the calculated n-th output.

8. The filtering method of claim 7, wherein the (n+1)-th output is calculated based on the following equation:

$$y'_2(n+1) = y'_{2even}(n+1) + y'_{2odd}(n+1)$$

where $y'_2(n+1)$ is the (n+1)-th output, $y'_{2even}(n+1)$ is a result of even filter coefficients of $y'_2(n+1)$, and $y'_{2odd}(n+1)$ is a result of odd filter coefficients of $y'_2(n+1)$.

9. The filtering method of claim 8, wherein an output from an even filter coefficient of the (n+1)-th output is calculated using an (n+2)-th output based on the following equation:

$$y'_2(n+2) = y''_2(n+2) - y'_{2even}(n+1) - y'_{2odd}(n+3)$$

where $y'_2(n+2)$ is the (n+2)-th output, $y''_2(n+2)$ is an operation result by dividing into an even filter coefficient and an odd filter coefficient to calculate $y'_2(n+2)$, $y'_{2even}(n+1)$ is a result of even filter coefficients of $y'_2(n+2)$, and $y'_{2odd}(n+3)$ is a result of odd filter coefficients of $y'_2(n+3)$.

10. A filtering method of a Finite Impulse Response (FIR) filter, the method comprising:
    determining whether a filter order is an integral multiple of 2 with respect to an input stream when the input stream is received;
    if it is determined that the filter order is the integral multiple of 2, performing a first filtering operation of filtering the input stream using 2N filter coefficients which are divided into even filter coefficients and odd filter coefficients, N being an integer greater than 0; and
    if it is determined that the filter order is not the integral multiple of 2, performing a second filtering operation of filtering the input stream, the second filtering operation comprising:
        performing the first filtering operation;
        performing a filtering operation with respect to the input stream using another filter coefficient; and
        adding a result of the first filtering operation and a result of the filtering operation using the other filter coefficient.

11. The filtering method of claim 10, wherein the first filtering operation comprises:
calculating a first operation result by multiplying a pair of consecutive input signals of the input stream and a pair of consecutive filter coefficients comprising an even filter coefficient among the even filter coefficients and an odd filter coefficient among the odd filter coefficients, respectively;
calculating a second operation result by multiplying the even filter coefficient and an input signal corresponding to the even filter coefficient;
calculating a third operation result by multiplying the odd filter coefficient and an input signal corresponding to the odd filter coefficient; and
calculating an n-th output of the input stream using the first operation result, the second operation result, and the third operation result.

12. The filtering method of claim 11, wherein the first operation result is calculated based on the following equation:

$$y''_2(n) = \sum_{k=0}^{N/2-1} (h(2k) + h(2k+1))[x(n-2k) + x(n-2k-1)]$$

where N is a filter order, y'2"(n) is the first operation result, x(n−2k) and x(n−2k−1) are the pair of the consecutive input signals, and h(2k)+h(2k+1) are the even filter coefficient and the odd filter coefficients respectively, which are the pair of the consecutive filter coefficients.

13. The filtering method of claim 11, wherein the second operation result is calculated based on the following equation:

$$y'_{2even}(n-1) = \sum_{k=0}^{N/2-1} h(2k)x(n-2k-1)$$

where N is a filter order, $y'_{2even}(n-1)$ is the second operation result, h(2k) is the even filter coefficient, and x(n−2k−1) is an input signal corresponding to h(2k).

14. The filtering method of claim 11, wherein the third operation result is calculated based on the following equation:

$$y'_{2odd}(n+1) = \sum_{k=0}^{N/2-1} h(2k+1)x(n-2k)$$

where N is a filter order, $y'_{2odd}(n+1)$ is the third operation result, h(2k+1) is the odd filter coefficient, and x(n−2k) is an input signal corresponding to h(2k+1).

15. The filtering method of claim 11, wherein the n-th output is calculated based on the following equation:

$$y'_2(n) = y''_2(n) - y'_{2even}(n-1) - y'_{2odd}(n+1)$$

where $y'_2(n)$ is the n-th output, $y''_2(n)$ is the first operation result, $y'_{2even}(n-1)$ is the second operation result, and $y'_{2odd}(n-1)$ is the third operation result.

16. The filtering method of claim 11, further comprising:
calculating an (n+1)-th output using the calculated n-th output.

17. The filtering method of claim 16, wherein the (n+1)-th output is calculated based on the following equation:

$$y'_2(n+1) = y'_{2even}(n+1) + y'_{2odd}(n+1)$$

where $y'_2(n+1)$ is the (n+1)-th output, $y'_{2even}(n+1)$ is a result of even filter coefficients of $y'_2(n+1)$, and $y'_{2odd}(n+1)$ is a result of odd filter coefficients of $y'_2(n+1)$.

18. The filtering method of claim 17, wherein an output of even filter coefficients of the (n+1)-th output is calculated from an (n+2)-th output based on the following equation:

$$y'_2(n+2) = y''_2(n+2) - y_{2even}(n+1) - y'_{2odd}(n+3)$$

where $y'_2(n+2)$ is the (n+2)-th output, $y''_2(n+2)$ is an operation result by dividing into an even filter coefficient and an odd filter coefficient to calculate $y'_2(n+2)$, $y'_{2even}(n+1)$ is a result of even filter coefficients of $y'_2(n+2)$, and $y'_{2odd}(n+3)$ is a result of odd filter coefficients of $y'_2(n+3)$.

19. A Finite Impulse Response (FIR) filter of a filter order 2N+1, where N is an integer greater than 0, the FIR filter comprising:
a 2N filter order processor which filters an input stream using 2N-ary filters and 2N filter coefficients divided into even filter coefficients and odd filter coefficients;
a (2N+1)-th filter order processor which filters the input stream using a (2N+1)-th filter coefficient; and
an addition part which adds up a filtering result of the 2N filter order processor and a filtering result of the (2N+1)-th filter order processor,
wherein the 2N-ary filters comprise 2N multipliers multiplying the input stream by the 2N filter coefficients, respectively.

20. The FIR filter of claim 19, wherein the 2N filter order processor:
calculates a first operation result by multiplying a pair of consecutive input signals of the input stream and a pair of consecutive filter coefficients comprising an even filter coefficient among the even filter coefficients and an odd filter coefficient among the odd filter coefficients, respectively;
calculates a second operation result using the even filter coefficient;
calculates a third operation result using the odd filter coefficient; and
calculates an n-th output of the input stream using the first operation result, the second operation result, and the third operation result.

21. The FIR filter of claim 19, wherein the 2N filter order processor calculates an (n+1)-th output using the n-th output.

22. A Finite Impulse Response (FIR) filter comprising:
a filter order determiner which determines whether a filter order is an integral multiple of 2 with respect to an input stream when the input stream is received;
a first filter which filters the input stream using 2N filter coefficients which are divided into even filter coefficient and odd filter coefficients, if the filter order determiner determines that the filter order is the integral multiple of 2, N being an integer greater than 0; and
a second filter which filters the input stream by:
performing the first filtering operation;
performing a filtering operation with respect to the input stream using another filter coefficient; and
adding a result of the filtering by the first filter and a result of the filtering operation using the other filter coefficient.

23. The low complexity FIR filter of claim 22, wherein the second filter comprises a (2N+1)-th filter and the other filter.

24. A non-transitory storage medium readable by a computer storing a program to execute a filtering method of a Finite Impulse Response (FIR) filter of a filter order 2N+1, where N is an integer greater than 0, the method comprising:

filtering an input stream using 2N-ary filters by dividing 2N filter coefficients into even filter coefficients and odd filter coefficients;

filtering the input stream using a (2N+1)-th filter and a (2N+1)-th coefficient; and adding up a filtering result of the 2N-ary filters and a filtering result of the (2N+1)-th filter, wherein the 2N-ary filters comprise 2N multipliers multiplying the input stream by the 2N filter coefficients, respectively.

* * * * *